US006844762B2

(12) United States Patent
Sanchez (10) Patent No.: US 6,844,762 B2
(45) Date of Patent: Jan. 18, 2005

(54) CAPACITIVE CHARGE PUMP

(75) Inventor: Hector Sanchez, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 8 days.

(21) Appl. No.: 10/283,869

(22) Filed: Oct. 30, 2002

(65) Prior Publication Data

US 2004/0085104 A1 May 6, 2004

(51) Int. Cl.[7] .............................................. H03L 7/06
(52) U.S. Cl. ..................................................... 327/157
(58) Field of Search ................................ 327/145–150, 327/156–159, 161, 536–537; 375/374–376

(56) References Cited

U.S. PATENT DOCUMENTS

| | | | | |
|---|---|---|---|---|
| 5,818,287 A | * | 10/1998 | Chow | 327/536 |
| 5,886,551 A | * | 3/1999 | Narahara | 327/157 |
| 5,898,336 A | * | 4/1999 | Yamaguchi | 327/157 |
| 6,233,441 B1 | | 5/2001 | Welland | |
| 6,437,637 B2 | * | 8/2002 | Myono | 327/536 |

FOREIGN PATENT DOCUMENTS

JP          11339463       12/1999

OTHER PUBLICATIONS

Holzer, "A 1V CMOS PLL Designed in High–Leakage CMOS Process Operating at 10–700MHz," *2002 IEEE International Solid State Circuits Conference Digest of Technical Papers*, 2002, pp. 272–273.
Lin et al., "A 900MHz, 2.5mA CMOS Frequency Synthesizer with an Automatic SC Tuning Loop," pp. 375–378.
Lin et al., "A 900MHz, 2.5mA CMOS Frequency Synthesizer with an Automatic SC Tuning Loop," *IEEE Journal of Solid–State Circuits*, vol. 36, No. 3, Mar. 2001, pp. 424–431.
"Switched Capacitor PLL Frequency Synthesizer," *16th National Radio Science Conference, NRSC'99*, Ain Shams University, Feb. 23–25, 1999, Cairo, Egypt.
McMahill, Daniel R. et al., "A 2.5–Mb/s GFSK 5.0–Mb/s 4–FSK Automatically Calibrated Σ–Δ Frequency Synthesizer," *IEEE Journal of Solid–State Circuits*, Jan. 2002, pp. 18–26, vol. 37, No. 1, USA.
Shih, Cheng–Chung et al., "Jitter Attenuation Phase Locked Loop Using Switched Capacitor Controlled Crystal Oscillator," *IEEE 1988 Custom Integrated Circuits Conference*, 1988, pp. 9.5.1–9.5.3, USA.
Takagi, Shigetaka et al., "Novel Automatic Tuning System using PLL with Switched Capacitor Circuit Technique," *IEEE*, 1998, pp. 699–702, USA.
PCT Searched Report PCT/US03/24462 mailed Jan. 20, 2004.

* cited by examiner

Primary Examiner—My-Trang Nu Ton
(74) *Attorney, Agent, or Firm*—David G. Dolezal; Joanna G. Chiu (57) ABSTRACT

A capacitive charge pump that can be implemented in such devices as e.g. a phase locked loop (PLL). The charge pump includes at least one capacitor in the charge path and discharge path for limiting the amount of charge provided to or removed from a filter capacitor of a PLL. In one example, a second capacitor may be provided in the charge path or discharge path to reduce the capacitance (if provided in series) or increase the capacitance (if provided in parallel) to adjust the maximum amount of charge transferred to a filter capacitor. In one example, multiple capacitive stages may be implemented in parallel to increase the maximum amount of charge transferred to a filter capacitor. Each stage is enabled after a delayed period of time from when the previous stage was enabled.

43 Claims, 7 Drawing Sheets

CAPACITIVE CHARGE PUMP

BACKGROUND OF THE INVENTION

1. Field of the Invention

This invention relates in general to electronic devices and specifically to charge pumps.

2. Description of the Related Art

Phase locked loops (PLL) are utilized by electronic devices to generate clock signals from a reference signal. The generated clock signal maybe at the same frequency as the reference clock signal or at a fractional or multiple frequency of the reference clock signal. The generated clock signal typically has a predetermined phase relationship with the reference clock signal.

Typically, a PLL utilizes a charge pump which receives clock control signals from a phase frequency detector (PFD) and provides current to a filter capacitor to control the voltage of a frequency control input of a voltage controlled oscillator (VCO).

With PLLs implemented in semiconductor devices, the filter capacitor may be constructed by utilizing CMOS technology. The drive to reduce the size of electronic devices has increased the difficulty of implementing filter capacitors in a semiconductor device. For example, reducing the thickness of gate oxides increases the gate leakage currents of a capacitor implemented in a semiconductor device. Also, reducing the size of semiconductor devices means that a proportionally larger area of the device must be allocated to obtain the same capacitance.

In addition, conventional charge pumps typically require high tolerance transistors and resistors to ensure reliable operation. As the size of semiconductor devices decreases, providing high tolerance transistors, resistors, and diodes becomes more difficult. What in needed is an improved charge pump for electronic circuits such as phase locked loops.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
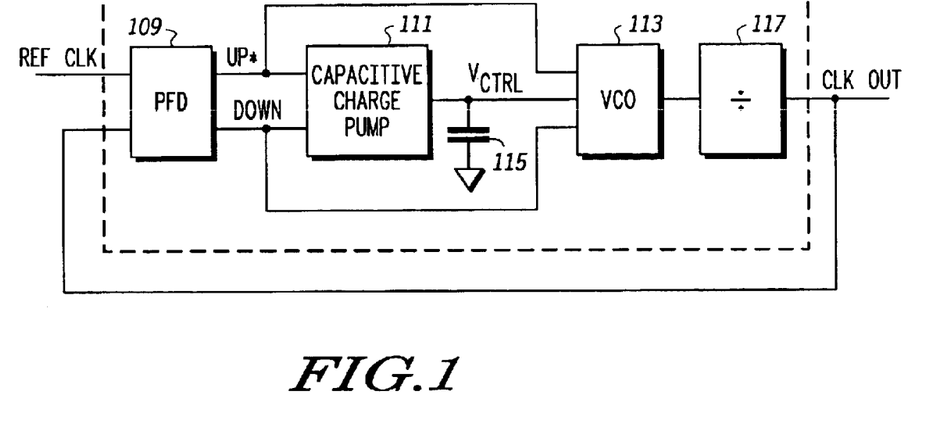
FIG. 1 is a block diagram of one embodiment of a phase locked loop according to the present invention.

FIG. 1 is a block diagram of a phase locked loop according to the present invention. Phase locked loop 105 includes an output for providing an output clock signal (CLK OUT) that may be at the same frequency, a fractional frequency, or multiple frequency of a reference clock signal (REF CLK) provided to an input of phase locked loop 105. The reference clock signal is provided to a phase frequency detector (PFD) circuit 109. PFD circuit 109 also receives the CLK OUT signal in a feed back loop. Based upon a comparison of the REF CLK signal and the CLK OUT signal, PFD circuit 109 provides two clock control signals (UP* and DOWN) to capacitive charge pump 111 for adjusting the frequency of the CLK OUT signal. Charge pump 111 provides charge to filter capacitor 115 in response to an asserted UP* signal or removes charge from capacitor 115 in response to an asserted DOWN signal. Capacitive charge pump includes capacitors (e.g. 211 and 217 in FIG. 2) in its charge and discharge paths for limiting the amount of charge provided to or discharged from capacitor 115. Capacitor 115 is connected to the input of voltage controlled oscillator 113 to provide the Vctrl signal whose voltage is based on the charge level of filter capacitor 115. VCO 113 provides at its output, a clock signal having frequency dependent upon the voltage of the Vctrl signal. In the embodiment of FIG. 1, the clock signal of VCO 113 is then provided to a frequency divider 117 that divides the frequency of the output of VCO 113 to produce the CLK OUT signal.

In the embodiment of FIG. 1, the UP* and DOWN control signals are also provided to VCO 113 for phase control of the output of VCO 113. However, other embodiments of a phase locked loop may include a resistor in series with filter capacitor 115 to control the phase of the output of VCO 113.

In one embodiment, phase locked loop 105 is implemented in an integrated circuit utilizing CMOS technology. Phase locked loop 105 may be integrated with other devices which utilize phase locked loop 105 such as e.g. with a processor in an integrated circuit. With other embodiments, the circuits of phase locked loop 105 may be implemented with other types of circuitry including e.g. with silicon on insulator (SOI) transistors or with discrete components.

Figure 2:
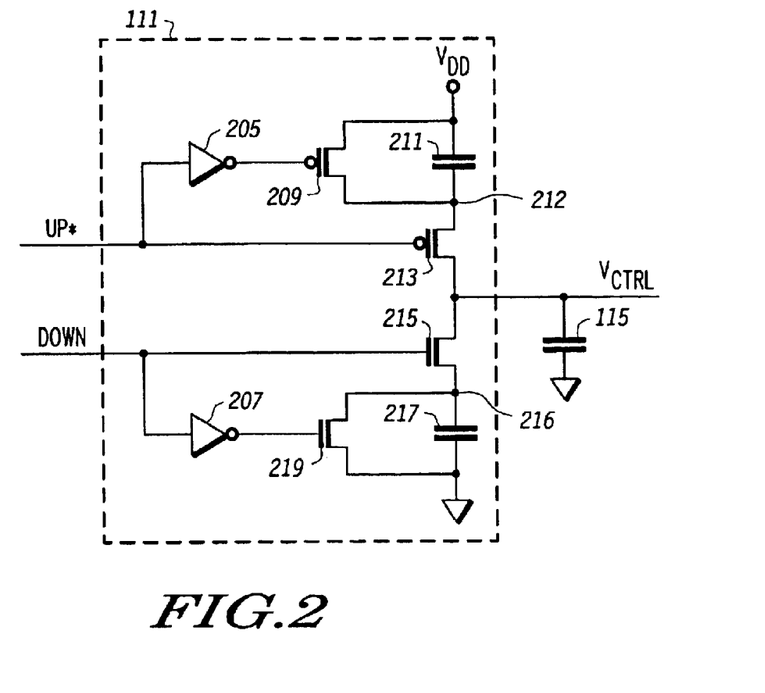
FIG. 2 is a circuit diagram of one embodiment of a charge pump and filter capacitor according to the present invention.

FIG. 2 is a circuit diagram of an embodiment of capacitive charge pump 111. Capacitive charge pump 111 has charge path that includes capacitor 211 for providing charge to filter capacitor 115 when enabled by the UP* control signal to increase the charge stored in filter capacitor 115. Capacitive charge pump 111 also has a discharge path that includes capacitor 217 for removing charge from filter capacitor 115 when enabled by the DOWN control signal to reduce the charge stored in filter capacitor 115. Capacitors 211 and 217 act to limit the amount of charge that flows into or out from filter capacitor 115 when enabled by the UP* and DOWN signals, respectively.

Limiting the amount of charge provided to or removed from a filter capacitor by capacitors 211 and 217 may advantageously limit the change in frequency of VCO 113 due to a noisy event (such as, e.g., in the REF CLK and CLK OUT signals) causing input phase error. With conventional charge pumps, the amount of charge provided to (or discharged from) a filter capacitor is proportional to the input phase error over a wide phase differential range. If one of the two inputs to PFD circuit 109 momentarily drifts due e.g. to noise, the error in the output of the VCO is relatively large due to that error. However, with the capacitive charge pump of FIG. 2, the amount of the charge provided to or discharged from filter capacitor 115 is limited by the capacitance of capacitors 211 and 217, respectively. Accordingly, the change in frequency of the output of VCO 113 due to drifts in the inputs of PFD circuit 109 can be minimized.

Figure 3:
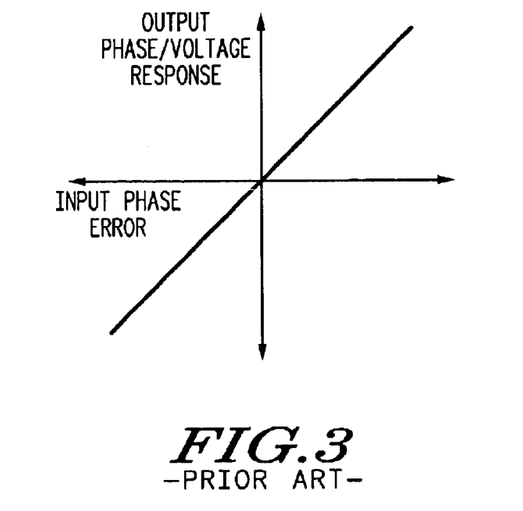
FIG. 3 shows a transfer function of an output phase/voltage response to an input phase error of a phase locked loop having a prior art charge pump.

FIG. 3 shows the transfer function of an output phase/voltage response to an input phase error of a phase locked loop having a prior art charge pump. As shown in FIG. 3, the output phase/voltage response provided by a prior art charge pump is proportional to the input phase error of the PFD circuit (e.g. 109). Accordingly, the greater the phase error between the REF CLK and the CLK OUT signal, the greater the change in the voltage level of Vctrl (and accordingly, the greater the change in frequency from that error).

Figure 4:
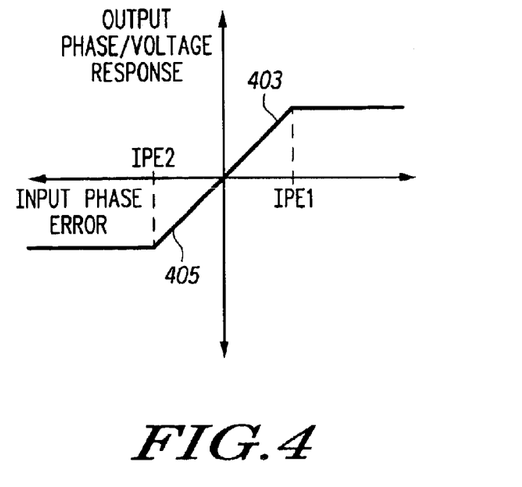
FIG. 4 shows a transfer function of an output phase/voltage response to an input phase error of a phase locked loop having a charge pump as shown in FIG. 2.

FIG. 4 shows the transfer function of an output phase/voltage response to the input phase error of phase locked loop 105 with charge pump 111. As shown in FIG. 4, the output phase/voltage response includes portion 403 that is proportional to the input phase error up to a specific input phase error value (IPE1). Proportional portion 403 is proportional due to the finite resistance of transistor 213, and proportional portion 405 of the negative input phase error portion of the transfer function is due to the finite resistance of transistor 215. The output phase/voltage response at IPE1 is constant due to the limitations in charge transfer from capacitor 211 to capacitor 115 and at IPE2, is constant due to the limitations in charge transfer from capacitor 115 to capacitor 217. This constant value is dependent upon the ratio of capacitor 211 (or capacitor 217) to capacitor 115. The slope of the positive proportional portion 403 may be adjusted by adjusting the resistance (e.g. by controlling the width or length) of transistor 213, and the slope of the negative proportional portion 405 may be adjusted by adjusting the resistance of transistor 215.

Referring back to FIG. 2, charge is provided to filter capacitor 115 from a power supply voltage source having potential of VDD (VDD) via the charge path including capacitor 211 and switch 213 (a PMOS transistor in the embodiment shown) when signal UP* is asserted (is driven to a low voltage level) to increase the voltage level of Vctrl for increasing the frequency of CLK OUT. Charge is removed from filter capacitor 115 via a discharge path including switch 215 (an NMOS transistor in the embodiment shown) and capacitor 217 when the DOWN signal is asserted (is driven to a high voltage level) to decrease the voltage level of Vctrl for decreasing the frequency of CLK OUT.

Capacitive charge pump 111 includes two node potential setting circuits for setting the voltage of nodes 212 and 216 prior to the assertion of the UP* and DOWN signals, respectively. The first potential setting circuit includes a transistor 209 that when made conductive by the inverted UP* signal (inverted via inverter 205), shorts node 212 to VDD, thereby removing the charge from capacitor 211. The second potential setting circuit includes transistor 219, which when made conductive by the inverted DOWN signal (inverted via inverter 207) shorts node 216 to ground, thereby removing the charge from capacitor 217.

When PFD circuit 109 asserts the UP* signal, the asserted UP* signal makes conductive transistor 213 and makes non conductive (via inverter 205) transistor 209 for charge to flow from VDD through capacitor 211 and transistor 213 to filter capacitor 115 to raise the voltage level of the Vctrl signal. As current flows through capacitor 211, the charge in capacitor 211 increases, thereby reducing the amount of charge flowing into filter capacitor 115, until the voltage level (which is falling as capacitor 211 charges) of node 212 is equal to the voltage of Vctrl (which is rising as capacitor 115 is rising). The voltage where the voltage level of node 212 equals the voltage level of Vctrl can be represented by the formula:

$$Vctrlfin = ((Vctrlin + K)/(1 + K))*(VDD)$$

Where Vctrlfin is the voltage level of node 212 when node 212 equals the voltage of Vctrl; Vctrlin is the voltage level of the Vctrl signal prior to the assertion of the UP* signal; and K is the ratio of the capacitance of capacitor 211 to the capacitance of filter capacitor 115.

When PFD circuit 109 deasserts the UP* signal (at the end of the UP* signal pulse in some embodiments) transistor 213 is made non conductive and transistor 209 is made conductive. When the UP* signal is deasserted, the voltage level on each terminal of capacitor 211 is at VDD, wherein capacitor 211 is discharged.

When PFD circuit 109 asserts the DOWN signal, the asserted DOWN signal makes conductive transistor 215 and makes non conductive (via inverter 207) transistor 219 for charge to flow from filter capacitor 115, via transistor 215 and capacitor 217, to lower the voltage level of signal Vctrl. As current flows through capacitor 217, the charge in capacitor 217 increases thereby reducing the amount of charge flowing out of filter capacitor 115 until the voltage level (which is rising as capacitor 217 charges) of node 216 is equal to Vctrl (which is falling as the charge in capacitor 115 is falling). This voltage level where the voltage level of node 212 equals the voltage level of Vctrl can be represented by the formula:

$$Vctrlfin = Vctrlin/(1 + K)$$

Where Vctrlfin is the voltage level of node 216 when node 216 equals the voltage level of the Vctrl signal; Vctrlin is the voltage level of the Vctrl signal prior to the assertion of the DOWN signal; and K is the ratio of the capacitance of capacitor 217 to the capacitance of filter capacitor 115.

When PFD circuit 109 deasserts the DOWN signal (at the end of a DOWN signal pulse in some embodiments) transistor 215 is made non conductive and transistor 219 is made conductive. At this time, the voltage level on each terminal of capacitor 217 is at system ground, wherein capacitor 217 is discharged.

Capacitors 211 and 217 are sized to control the maximum change in the voltage level of the Vctrl signal when the UP* and DOWN signals are asserted, respectively. For example, the greater the ratio (K) of the capacitance of capacitor 211 to the capacitance of filter capacitor 115, the greater the increase in the voltage level of Vctrl (and accordingly, the greater the increase in the frequency of CLK OUT in the embodiment shown) for the period of the assertion of the *UP signal. Also, the greater the ratio of the capacitance of capacitor 217 to the capacitance of filter capacitor 115, the greater the decrease in Vctrl for the period of the assertion of the DOWN signal. In some embodiments, the capacitance of filter capacitor 115 is significantly greater (e.g. ≧100×) than the capacitance of capacitor 211 or 217. In one embodiment, the capacitance of filter capacitor 115 is 2000 times greater than the capacitance of capacitor 211 or capacitor 217.

Because the change in the voltage level of Vctrl is dependent upon the (K) ratio, a reduction in device technology may not necessarily require an increase in the percentage of the area of a device needed for a filter capacitor. With some embodiments, capacitors 211 and 217 may be size such that they are the minimum capacitor size that can be reliably manufactured for the device technology size. With some decreasing technologies sizes, the minimal capacitor size may be reduced. Thus, the size of capacitors 211 and 217 would be reduced with such technologies. Accordingly, because the change in the voltage level of Vctrl is dependent upon the K ratio, the size of capacitor 115 could be reduced proportionally to maintain the K ratio. Consequently, a reduction in device technology size may allow for a reduction in the total area required for a filter capacitor.

In one embodiment, capacitors 211, 217, and 115 are metal capacitors having metal comb structure that spans multiple metal levels in an integrated circuit implementing phase locked loop 105. However, in other embodiments, the capacitors may be made from transistors configured to provide capacitance or may be implemented by other techniques.

Figure 5:
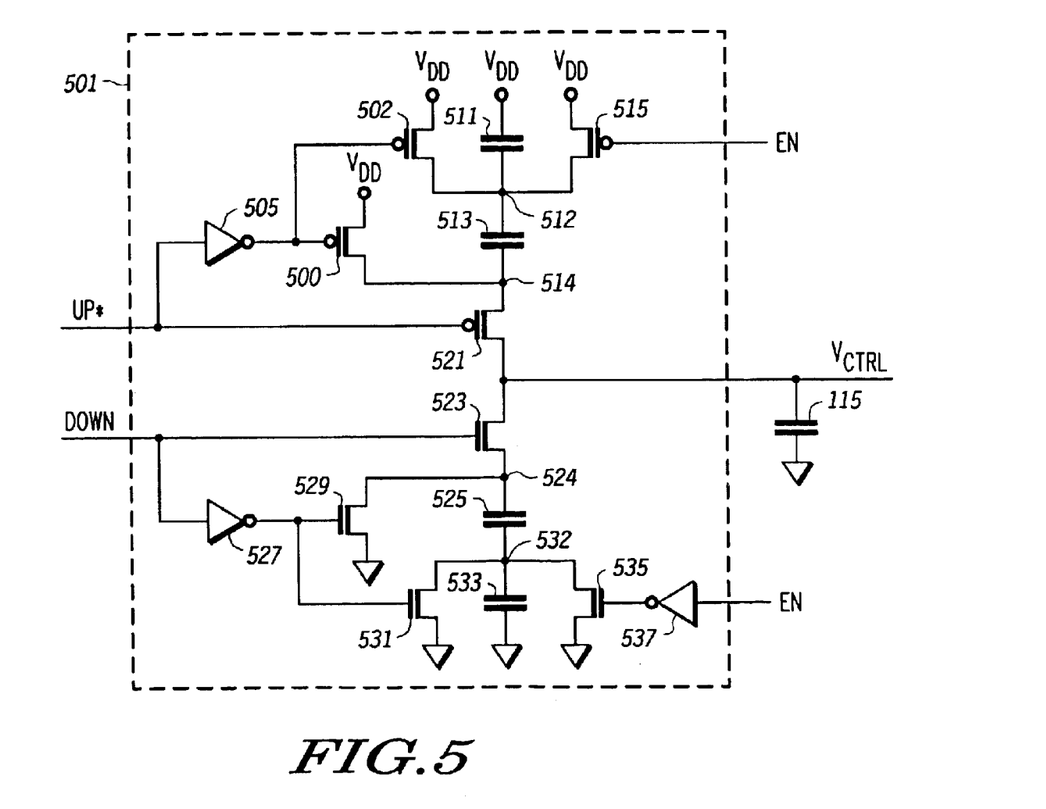
FIG. 5 is a circuit diagram of one embodiment of a charge pump and filter capacitor according to the present invention.

FIG. 5 is another embodiment of a capacitive charge pump according to the present invention. Capacitive charge pump 501 may be utilized in PLL 105 in place of charge pump 111. Charge pump 501 includes a second capacitor 511 that can be selectively implemented in the charge path and a second capacitor 533 that can be selectively implemented in the discharge path to decrease the amount of charge transferred by the charge pump and to decrease the maximum value for the output phase/voltage transfer function response of a phase locked loop implementing the charge pump of FIG. 5. Two capacitors in series (e.g. 511 and 513) act to decrease the effective capacitance of the charge path (or discharge path), thereby decreasing the ratio (K) of the charge path capacitance (or discharge path capacitance) with respect to the capacitance of filter capacitor 115. Accordingly, with two capacitors in series, the effective capacitance of the charge and discharge paths can be less than the minimum capacitor size for the device technology utilized. Also, selectively implementing a second capacitor in the charge path (or discharge path) allows for a device to selectively enable a different transfer functions in a phase locked loop.

The additional capacitance (e.g. 511 or 533) in the charge pump 501 is enabled by an enable signal (EN) that is provided from a circuit that controls the transfer function characteristics of a phase locked loop implementing charge pump 501. An example of such a circuit may be an I/O device (not shown) that is programmed by a processor (not shown) for setting the transfer function of the phase locked loop via software. In other embodiments, the enable signal may be provided by hardware circuitry in response to a specific condition such as e.g. a power on reset. In some embodiments, the enable signal could be hardwired by the manufacture of the device implementing the phase locked loop.

In the embodiment of FIG. 5, the enable signal is asserted (brought to a high voltage level) to implement the second series capacitor (511 and 533) in both the charge and discharge path. A high voltage on the EN signal line makes bypass transistor 515 non conductive, wherein the only current path from VDD to capacitor 513 when the UP* is asserted is through capacitor 511. When the EN signal is not asserted (is at a low voltage), transistor 515 is conductive wherein node 512 is short circuited to VDD via transistor 515. Accordingly, when EN is not asserted, only capacitor 513 is in the charge path when the UP* signal is asserted. Other embodiments would not utilize enabling transistors wherein the second capacitors would always be implemented in the charge and discharge paths.

When the EN signal is asserted, transistor 535 is made non conductive via inverter 537. When the EN signal is asserted, the only path from ground to capacitor 525 is through capacitor 533 when the DOWN signal is asserted. When the EN signal is not asserted (a low voltage), transistor 535 is made conductive to short node 532 to system ground, thereby bypassing capacitor 533. Accordingly, when EN is not asserted, only capacitor 525 is in the discharge path when the DOWN signal is asserted.

Charge pump 501 includes a node potential setting circuit that includes transistor 502 for pulling node 512 to VDD and a node potential setting circuit that includes transistor 500 for pulling node 514 to VDD when the UP* signal is not asserted. Transistors 500 and 502 are made conductive by a non asserted UP* via inverter 505. Pulling nodes 512 and 514 to VDD discharges capacitors 511 and 513 in that both terminals of each capacitor is at the same voltage potential. Charge pump 501 also includes two node potential setting circuits (transistors 519 and 531) for pulling node 524 and 532 to ground, respectively, to discharge capacitors 525 and 533 when the DOWN signal is non asserted.

Figure 6:
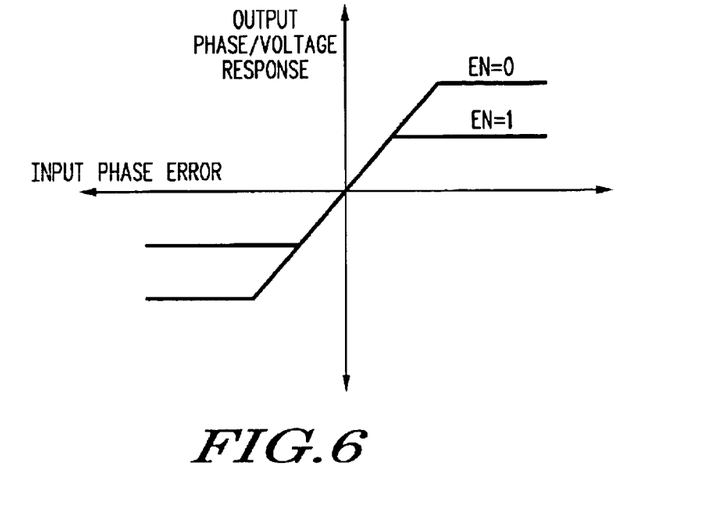
FIG. 6 shows a transfer function of an output phase/voltage response to an input phase error of a phase locked loop having a charge pump as shown in FIG. 5.

FIG. 6 shows the two tiered transfer function of a phase locked loop implementing charge pump 501. When the enable signal (EN) is asserted (EN=1), the amount of charge that is allowed through both the charge path and discharge path is limited at a lower amount than when the enable signal is not asserted (EN=0). This due to the fact that when the enabled signal is asserted, the second capacitor (e.g. 511 and 533) is included in the charge or discharge path to lower the effective capacitance of the charge or discharge path and to therefore reduce the ratio (K) of the capacitance of the charge or discharge path with respect the capacitance of filter capacitor 115. Accordingly, the maximum response to an input phase error is less when the enable signal is asserted than when it is not asserted.

Figure 7:
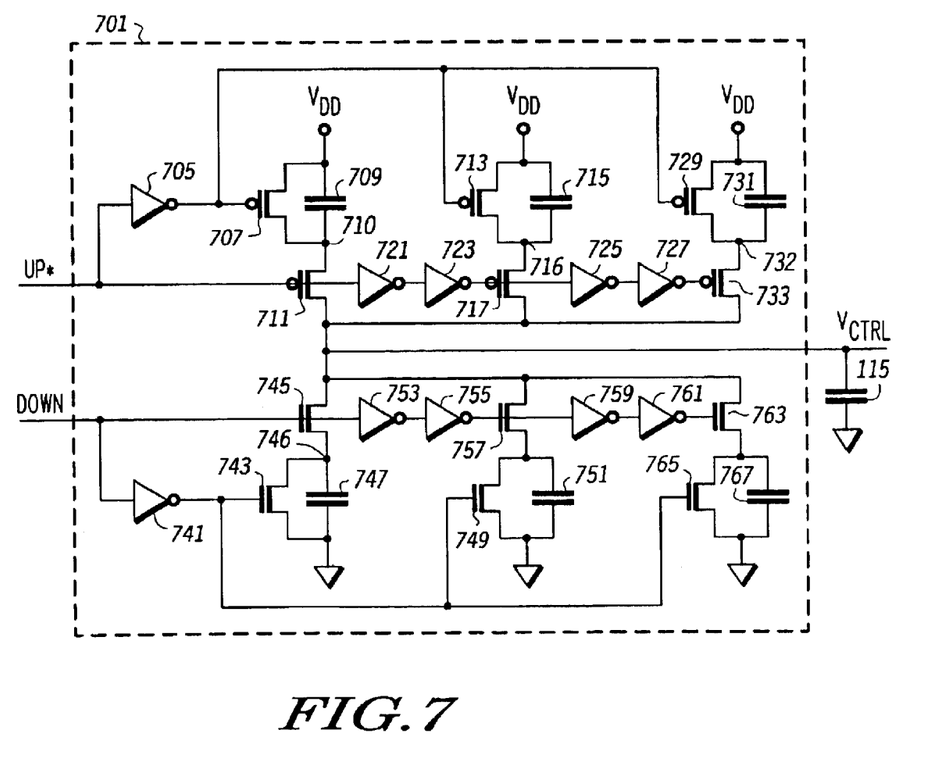
FIG. 7 is a circuit diagram of one embodiment of a charge pump and filter capacitor according to the present invention.

FIG. 7 is another embodiment of a capacitive charge pump according to the present invention. Capacitive charge pump 701 may be implemented in phase locked loop 105 in place of capacitive charge pump 111 (See FIG. 1). Charge pump 701 includes multiple capacitive stages in both the charge and discharge paths for increasing the effective capacitance of those paths to increase the maximum value of the output phase/voltage response of a phase locked loop implementing capacitive charge pump 701 according to the present invention.

The charge path of capacitive charge pump 701 includes three capacitive stages with each stage having a capacitor (709, 715, and 731) that may be coupled in parallel with the other two capacitors to provide capacitance to the charge path. Each capacitor stage also includes a coupling transistor (711, 717, and 733) to couple the capacitor of the capacitive stage to be part of the charge path. For example, when coupling transistor 717 is conductive, capacitor 715 is part of the charge path wherein the capacitance of capacitor 715 provides capacitance to the charge path. Each capacitive stage also includes a node potential setting circuit that includes a transistor (707, 713, and 729) that when made conductive by a non asserted UP* signal (via inverter 705), pull nodes 710, 716, and 732 to VDD, respectively, to discharge capacitors 709, 715, and 731, respectively.

The discharge path also includes three capacitive stages that each include a capacitor (747, 751, and 767) a coupling transistor (745, 757, and 763), and a node potential setting circuit that includes a transistor (743, 749, and 765) for discharging the capacitor (747, 751, and 767) of its stage to ground in response to a non asserted DOWN signal via inverter 741.

In the embodiment of FIG. 7, each capacitive stage of the charge path and discharge path is serially enabled such that the capacitance of a capacitive stage is coupled to the charge or discharge path at a later time than the capacitance of a previous stage. For example, the signal that makes coupling transistor 717 (the coupling transistor of the second capacitive stage of the charge path) conductive is a delayed asserted UP* signal that is delayed by inverters 721 and 723. However, if the UP* is below a minimum threshold in duration (as set by the minimum delay of inverters 721 and 723) then transistor 717 is never made conductive and the capacitance of capacitor 715 is never added to the charge path. The signal that controls transistor 733 is the signal that controls transistors 717 delayed by inverters 725 and 727. Accordingly, transistor 733 is only made conductive if the delayed pulse provided to transistor 717 is greater than a threshold set by inverters 725 and 727.

Figure 8:
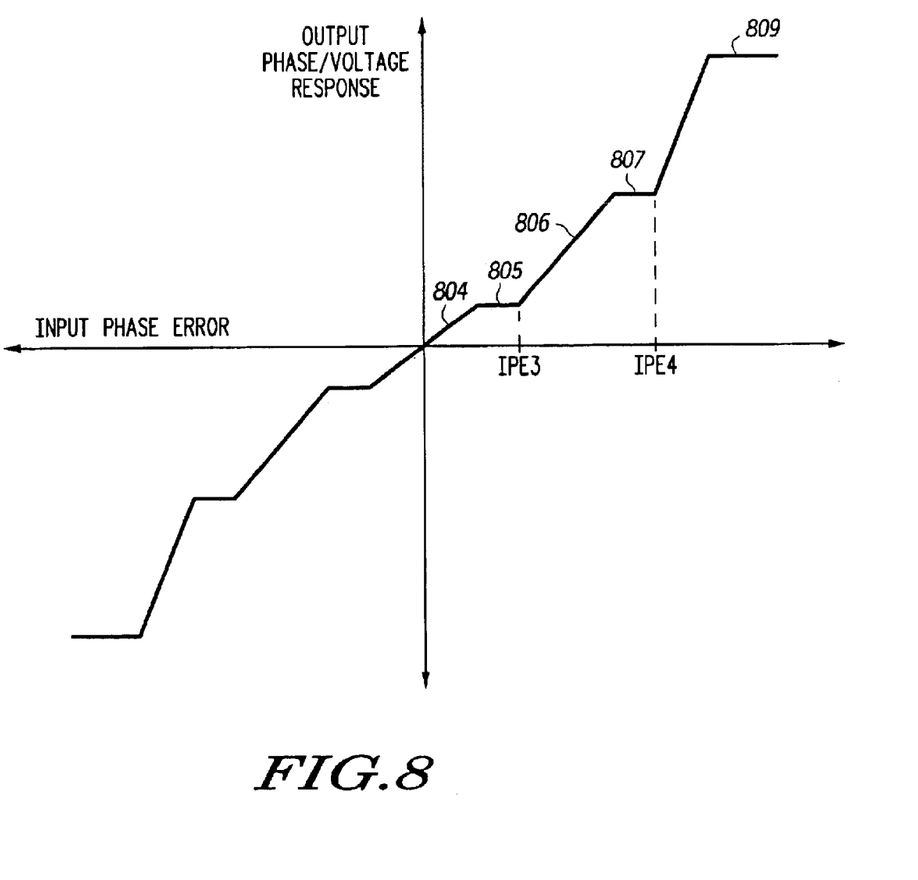
FIG. 8 shows a transfer function of an output phase/voltage response to an input phase error of a phase locked loop having a charge pump as shown in FIG. 7.

FIG. 8 shows the transfer function of an output phase/voltage response to an input phase error of a phase locked loop that includes a charge pump 701. Line portion 805 shows the maximum output phase/voltage response when only capacitor 709 is located in the charge path. Line portion 807 shows the maximum output phase/voltage response when capacitors 709 and 715 are located in the charge path. Line portion 807 is greater than line portion 805 due to the greater capacitance of capacitors 709 and 715 in the charge path than when only capacitor 709 is in the charge path. Line portion 809 is the maximum output phase/voltage response when capacitors 709, 715, and 731 are part of the charge path.

Because of the delay provided by inverters 721 and 723, capacitor 715 is not implemented in the charge path until the UP* signal has been asserted for a predetermined period of time. This predetermined time corresponds to an input phase error having a predetermined value (IPE3). For input phase errors of greater than IPE3, the output/phase voltage response increases at a rate (as shown by line portion 806) set by the combined resistance of transistors 711 and 717 in parallel. Accordingly, line portion 806 has a steeper slope than line portion 804 (whose slope is determined by the resistance of transistor 711). Capacitor 731 is not implemented in the charge path until the UP* signal has been asserted for another predetermined period of time which corresponds to an input phase error of IPE4. In one embodiment, IPE3 corresponds to a delay time of 20 picoseconds and IPE4 corresponds to a delay time of 40 picoseconds.

As shown by the transfer function of FIG. 8, a PLL implementing charge pump 701 has a limited response to small input errors, but a faster response to larger errors due to the added capacitive stages that may be implemented in the charge and discharge paths. Accordingly, the charge pump of FIG. 7 may provide a PLL with the advantages of limited charge transfer for small input phase errors and yet allow for a faster response (e.g. faster lock time) for larger input phase errors.

In a modification of FIG. 7, the inverters 721, 723, 725, 727, 753, 755, 759, and 761 may be removed where capacitors 709, 715, and 731 would be immediately implemented in the charge path when the UP* signal is enabled and capacitors 747, 751, and 767 would be implemented in the discharge path when the DOWN signal is asserted. In such an embodiment, the gates of transistors 711, 717, and 733 would be tied together to received the UP* signal and the gates of transistors 745, 757, and 763 would be tied together to receive the DOWN signal. In another modification, capacitors 715 and 731 would be tied to node 710, capacitors 751 and 767 would be tied to node 746, and transistors 717, 733, 757, and 763 would be removed. In a further modification, for the second and third capacitive stage of each of the charge and discharge paths, an enabling transistor (not shown) would be located between the capacitor (e.g. 715) and the coupling transistor (e.g. 717). The enabling transistor would be controlled by an enable signal (not shown) such that the capacitor of the stage may be selectively implemented in the charge or discharge path to selectively increase the capacitance in the charge or discharge path based upon the enable signal. Accordingly, such a charge pump may provide a PLL implementing the charge pump with three different transfer functions based upon the number of capacitive stages enabled.

Other embodiments may include more than three capacitive stages in both the charge and discharge paths. Also, as a further modification of FIG. 7, each capacitor stage may includes a second capacitor located in series with the first capacitor (e.g. 709, 715, 731). See for example, the circuit of FIG. 5 showing two capacitors in series in a charge path. These second capacitors may be selectively implemented in some embodiments.

Figure 9:
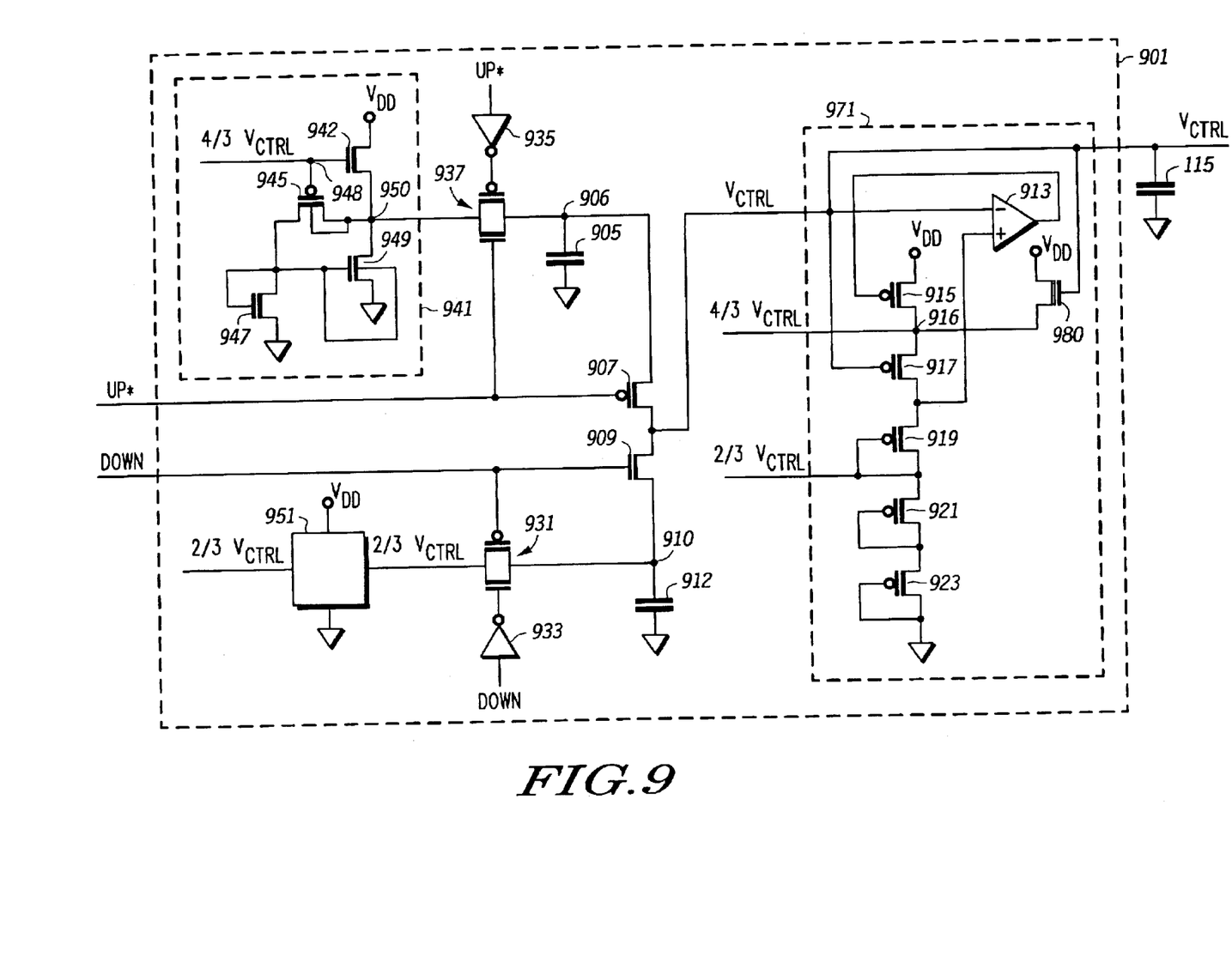
FIG. 9 is a circuit diagram of one embodiment of a charge pump and filter capacitor according to the present invention.

FIG. 9 shows another embodiment of a charge pump according to the present invention. Capacitive charge pump 901 may be implemented in PLL 105 in place of charge pump 111. Charge pump 901 of FIG. 9 differs from the charge pump of FIG. 2 in that the terminal of capacitor 905 that is connected to the coupling transistor 907 (at node 906) is set to a voltage proportional to Vctrl when the UP* is non asserted. The other side of capacitor 905 is connected to system ground. Node 910 is also set to a voltage proportional to Vctrl when the DOWN signal is not asserted. In the embodiment of FIG. 9, node 906 is set at a voltage of 4/3 Vctrl and node 910 is set to a voltage of 2/3 Vctrl.

Setting node 906 to 4/3 Vctrl and setting node 910 to 2/3 Vctrl enables the charge path of charge pump 901 to provide the same magnitude of charge in response to a positive input phase error as the magnitude of charge that the discharge path removes in response to a negative input phase error of the same magnitude regardless of the voltage level of Vctrl. With the embodiment of FIG. 2 (and of FIGS. 5 and 7), this condition (the amount of charge provided equals the amount of charge removed) only occurs when Vctrl=VDD/2. Else, the magnitude of charge supplied is dependent upon the difference from Vctrl to VDD and the magnitude of the charge removed is dependent upon the difference of Vctrl to system ground.

Charge pump 901 includes a potential setting circuit for setting node 906 to a potential of 4/3 the voltage of Vctrl. The potential setting circuit includes a pass gate 937 having one control terminal coupled to received the UP* signal and the other control terminal coupled to receive an inverted UP* signal via inverter 935. When the UP* signal is non asserted, pass gate 937 allows node 906 to be pulled to a voltage of 4/3 Vctrl (the voltage at node 950). Setting the voltage of node 906 to 4/3 Vctrl charges capacitor 905 to a predetermined charge level when the UP* signal is non asserted. When the UP* signal is asserted, charge stored in capacitor 905 is transferred to filter capacitor 115 to raise the voltage of Vctrl.

In the embodiment shown, the potential setting circuit includes a level shifter 941 (that includes transistors 942, 945, 947 and 949) whose output voltage (node 950) matches its input voltage (node 948). Node 948 is connected to node 916 of voltage generator 971. A level shifter is implemented so that the charging of capacitor 905 does not drain current from fractional voltage generator 971. If node 950 exceeds 4/3 Vctrl, transistors 945, 947, and 949 turn on to drain current from node 950 to reduce the voltage of node 950 back to 4/3 Vctrl. In the embodiment shown, the transistors 945, 947, and 949 are implemented with SOI transistors with their transistor bodies being connected as shown in FIG. 9. In other embodiments, other types of level shifters may be utilized.

Charge pump 901 also includes a potential setting circuit for setting the potential of node 910 to a voltage of 2/3 Vctrl when the DOWN signal is non asserted. This second potential setting circuit includes a pass gate 931 and a level shifter 951 similar to level shifter 941.

Charge pump 901 includes a fractional voltage generator 971 for generating fractional voltages of Vctrl, which are provided to level shifters 941 and 951. The fractional voltages generated are used to set the voltage levels of nodes 906 and 910 to fractions of Vctrl. Voltage generator 971 includes a comparator 913 whose inverting input is connected to receive the Vctrl signal and its non inverting input connected to the drain electrode of transistor 917. The output of comparator 913 is connected to the gate of transistor 915, which acts as a current source. In one embodiment, transistor 915 is smaller than transistors 917, 919, 921, and 923. Comparator 913 controls transistor 915 such that the voltage level at the drain of transistor 917 is equal to Vctrl. In the embodiment of FIG. 9, the gate of transistor 917 is connected to Vctrl, but may be connected to the drain electrode of transistor 917 in other embodiments. Transistors 917, 919, 921, and 923 are of the same size and form a voltage divider such that the drain electrode of transistor 915 is at the voltage level of 4/3 the voltage of Vctrl and the drain electrode of transistor 919 is at 2/3 the voltage of Vctrl. NMOS transistor 980 provides a small amount of leakage current to node 916 when Vctrl is equal to 0V such that the voltage at node 916 is greater than 0V when Vctrl equals 0V. Transistor 980 is smaller than transistor 917, 919, 921, and 923. With some embodiments, the gate of transistor 980 would be connected to the output of comparator 913. With other embodiments, nodes 906 and 910 may be set at other fractional voltages of Vctrl. Also with other embodiments, fractional voltage generator 971 may include other types of conventional current sources or leakage current circuits.

The circuit of FIG. 9 may be modified to provide selective enablement of additional capacitance in the charge path and discharge path (either in series with or in parallel with capacitors 905 and 912). For example, FIG. 10 sets forth an embodiment of a charge pump 1001 similar to charge pump 901 except that charge pump 1001 includes circuitry for selectively enabling a second capacitor in series in the charge path and a second capacitor in series in the discharge path.

Figure 10:
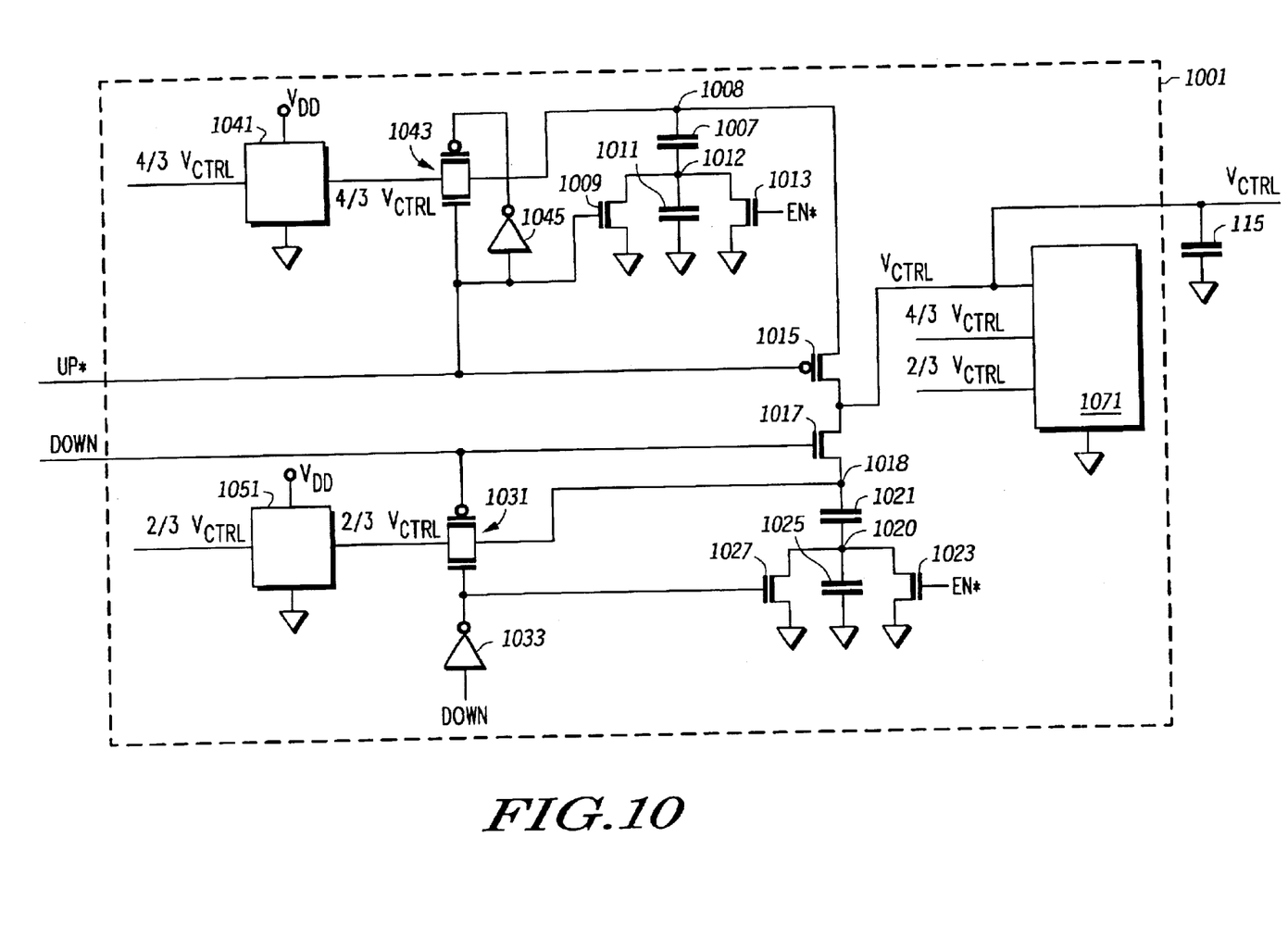
FIG. 10 is a circuit diagram of one embodiment of a charge pump and filter capacitor according to the present invention.

Charge pump 1001 includes an enabling transistor 1013, that when an enable signal (EN*) is non asserted, is non conductive such that capacitor 1007 is only coupled to ground via capacitor 1011 when the UP* signal is asserted. When the enable signal is non asserted (EN* is high), transistor 1013 is made conductive to short node 1012 to ground such that the charge path does not include capacitor 1011. When the enable signal (EN*) is asserted (EN* is low), transistor 1013 is non conductive such that charge flows from capacitor 1011 to capacitor 1007 when the UP* signal is asserted. As with the embodiment of FIG. 5, implementing a second capacitor in the charge path acts to reduce the maximum output phase/voltage response of a PLL implementing charge pump 1001.

Charge pump 1001 also includes a second capacitor 1025 that is implemented in the discharge path when the enable signal (EN*) is asserted and the DOWN signal is asserted. When transistor 1023 is conductive due to the enable signal (EN*) being non asserted, node 1020 is shorted to ground thereby removing capacitor 1025 from the discharge path. When the enable signal (EN*) is asserted, charge is removed from Vctrl via capacitor 1021 and capacitor 1025 when the DOWN signal is asserted.

Charge pump 1001 also includes a potential setting circuit for setting the voltage of node 1008 to 4/3 Vctrl when the UP* signal is non asserted and includes a second potential setting circuit for setting the potential of node 1018 to 2/3 Vctrl when the DOWN signal is non asserted. Both potential setting circuits of charge pump 1001 each include a level shifter (1041 and 1051) that is similar to level shifter 941 of FIG. 9. Charge pump 1001 also includes a fractional voltage generator 1071 for providing a voltage that is 4/3 of Vctrl to level shifter 1041 and a voltage that is 2/3 of Vctrl to level shifter 1051. Fractional voltage generator 1071 is similar in design to fractional voltage generator 971 of FIG. 9.

Charge pump 1001 also includes another potential setting circuit that includes transistor 1009 for setting the voltage of node 1012 to ground when the UP* signal is non asserted. Charge pump 1001 includes still another potential setting circuit including transistor 1027 for setting the voltage of node 1020 to ground when the DOWN signal in non asserted.

Referring back to FIG. 9, charge pump 901 may be further modified to include additional capacitive stages in parallel with capacitors 905 and 912. These additional capacitive stages may be selectively enabled to provide selective control over the transfer function of PLL implementing the charge pump. In addition, the control signals for implementing these additional capacitive stages may be delayed so as to provide a greater maximum output phase/voltage response for large input phase errors. See the discussion of FIGS. 7 and 8 above.

In another modification of charge pump 901, nodes 906 and 910 would be set to VDD and ground, respectively, when the UP* signal and the DOWN signal are non asserted, respectively. These modifications would not utilize fractional voltage generator 971 (and in some embodiments level shifter 941 and level shifter 951). An example of a charge pump modified in such a way would appear similar to charge pump 111 of FIG. 2, except that the terminal of capacitor 211 connected to VDD (in FIG. 2) would be connected to ground instead.

Figure 11:
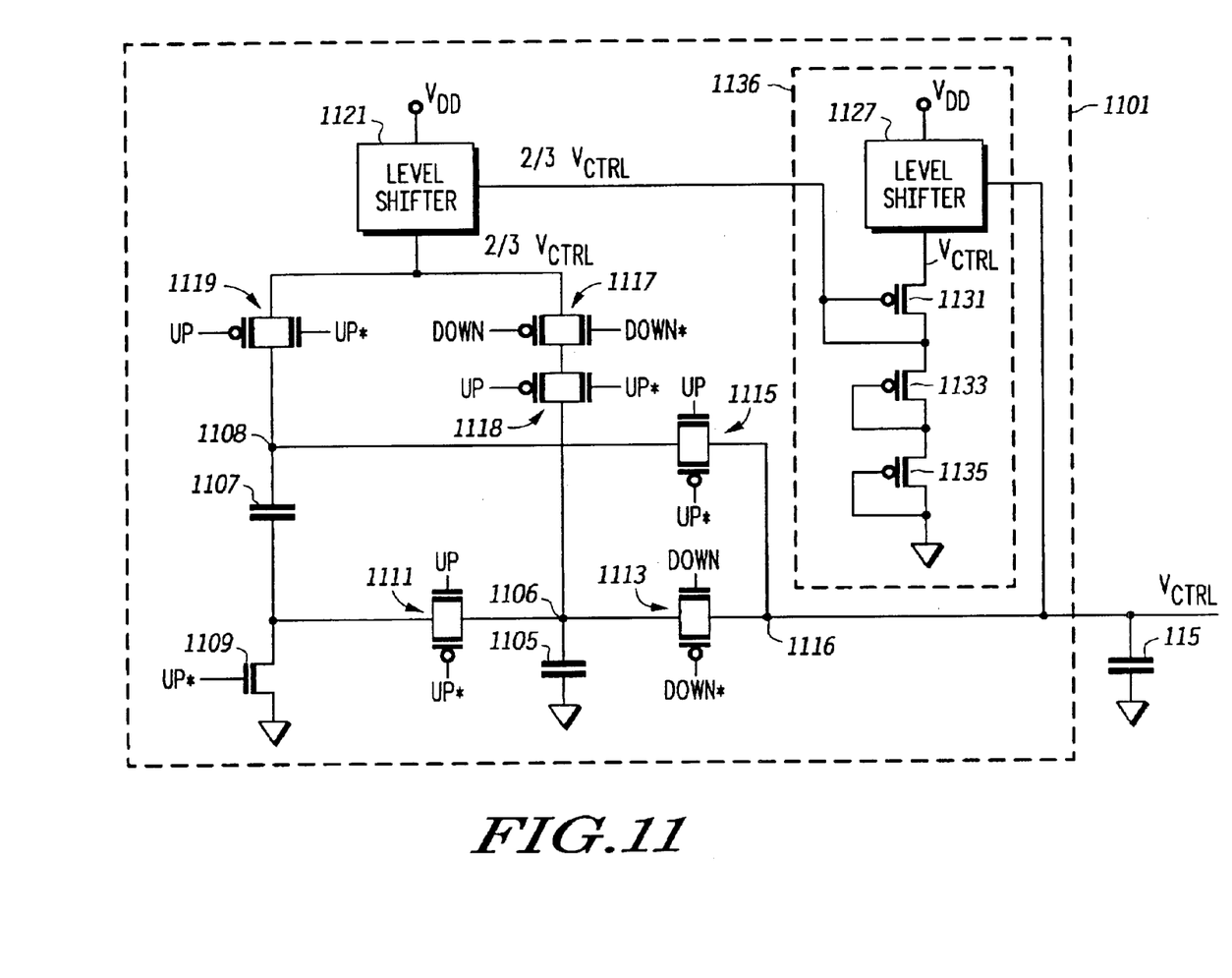
FIG. 11 is a circuit diagram of one embodiment of a charge pump and filter capacitor according to the present invention.

FIG. 11 shows another embodiment of a capacitive charge pump according to the present invention. Capacitive charge pump 1101 may be implemented in PLL 105 in place of charge pump 111. Charge pump 1101 utilizes a capacitor 1105 that is located in the discharge path when the DOWN signal is asserted and is located in series with capacitor 1107 in the charge path with the UP* signal is asserted. Capacitors 1107 and 1105 are each precharged such that a voltage across the capacitor is 2/3 of Vctrl prior to the assertion of the UP* and DOWN signals.

When the UP* signal is asserted to provide charge to filter capacitor 115, pass gates 1111 and 1115 are conductive and pass gates 1113, 1118 and 1119 and transistor 1109 are non conductive to provide a charge path from capacitor 1105 via pass gate 1111, capacitor 1107, pass gate 115 to Vctrl. Because both capacitor 1107 and 1105 are precharged to have a voltage drop of 2/3 of Vctrl, the voltage at node 1108 when the UP* is first asserted is at 4/3 Vctrl. The UP signal and the DOWN signal are the inverted UP* signal and inverted DOWN signal, respectively, provided by inverters (not shown).

When the DOWN signal is asserted to remove charge from filter capacitor 115, pass gate 1113 is conductive and pass gates 1111, 1115, 1117 are non conductive to provide a discharge path from capacitor 115 to capacitor 1105 via pass gate 1113. Because capacitor 1105 is precharged to have a voltage drop of 2/3 Vctrl, the voltage at node 1106 is at 2/3 Vctrl when the DOWN signal is first asserted.

Charge pump 1101 includes potential setting circuits for setting the voltages at nodes 1108 and 1106 at 2/3 Vctrl when the DOWN signal and UP* signal are non asserted. Pass gate 1119 and transistor 1109 are conductive and pass gates 1111 and 1115 are non conductive with the UP* signal is non asserted to pull node 1108 to 2/3 of the voltage of Vctrl, thereby charging capacitor 1107 such that the voltage drop across capacitor 1107 is 2/3 Vctrl.

When the UP* is non asserted and the DOWN signal is non asserted, pass gates 1117 and 1118 are conductive and pass gates 1111 and 1113 are non conductive to pull node 1106 to 2/3 of the voltage of Vctrl, thereby charging capacitor 1105 such that the voltage drop across capacitor 1105 is 2/3 Vctrl.

Charge pump 1101 includes fractional voltage generator 1136 that includes transistors 1131, 1133, and 1135 and level shifter 1127. Fractional voltage generator 1136 has an input connected to receive the Vctrl signal and provides at an output to level shifter 1121 a voltage of 2/3 Vctrl. Level shifter 1121 signal, which is similar in design to level shifter 941, provides at its output a voltage of 2/3 Vctrl to pass gates 1119 and 1117.

Those of skill in the art will recognize that, based upon the teachings herein, several modifications may be made to the embodiments shown and described herein. For example a capacitive charge pump as shown in the Figures may be implemented with other types of devices e.g. such as with other types of transistors and/or have other types of configurations. Also, features shown or described with regard to one embodiment may be included in other embodiments shown or described herein. Also charge pumps shown or described herein may be implemented in other types of circuits such as is in control loops with feedback (e.g. power, temperature, or frequency control).

In one aspect of the invention, a charge pump includes an output node and a first capacitor having a first terminal coupled to a first circuit node. The charge pump also includes a first switch having a first current electrode coupled to the first circuit node, a control electrode coupled to receive a first switch control signal, and a second current electrode coupled to the output node. The first switch control signal controls charge transfer between the first capacitor and the output node.

In another aspect of the invention, a phase locked loop (PLL) circuit includes a filter capacitor and a phase frequency detector circuit having a first input to receive a first clock, a second input to receive a second clock, and a first output to provide a first clock control signal based on the first clock and the second clock. The phase locked loop circuit also includes a voltage controlled oscillator having an input coupled to a first terminal of the filter capacitor and an output to provide an output clock. The phase locked loop circuit further includes a charge pump having a first input to receive the first clock control signal and an output coupled to the first terminal of the filter capacitor and the input of the voltage controlled oscillator. The charge pump includes a first capacitor having a first terminal and a first switch having a first current electrode coupled to the first the first terminal of the first capacitor. The first switch also includes a control electrode coupled to receive the first clock control signal and a second current electrode coupled to the first terminal of the filter capacitor. The first switch selectively couples the first capacitor to the filter capacitor, based on the first clock control signal.

In another aspect of the invention, a charge pump includes an output node, a charge path including a first capacitor, and a first switch including a control electrode coupled to receive a first charge control signal. The first capacitor selectively provides charge, based on the first charge control signal, to the output node via the first switch.

The charge pump also includes a discharge path including a second capacitor and a second switch having a control electrode coupled to receive a second charge control signal. The second capacitor selectively receives charge, based on the second charge control signal, from the output node.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A charge pump, comprising:
   an output node;
   a first capacitor having a first terminal coupled to a first circuit node; and
   a first switch having a first current electrode coupled to the first circuit node, a control electrode coupled to receive a first switch control signal, and a second current electrode coupled to the output node, wherein the first switch control signal controls charge transfer between the first capacitor and the output node;
   a second capacitor having a first terminal coupled to a second circuit node;
   a second switch having a first current electrode coupled to the second circuit node, a second current electrode coupled to the output node;
   a delay circuit having an input coupled to receive the first switch control signal and an output coupled to a control electrode of the second switch.

2. The charge pump of claim 1, wherein the output node is coupled to a filter capacitor that is significantly greater than the first capacitor.

3. The charge pump of claim 1, further comprising a potential setting circuit coupled to the first circuit node, wherein the potential setting circuit selectively sets, based on the first switch control signal, the first circuit node to a first potential.

4. The charge pump of claim 3, wherein the potential setting circuit includes a third switch having a control terminal coupled to receive an inverted signal of the first switch control signal, a second terminal coupled to a first voltage supply, and a third terminal coupled to the first circuit node.

5. The charge pump of claim 1, wherein the first switch selectively couples the first capacitor to the output node in response to the first switch control signal.

6. The charge pump of claim 1 wherein:
the first capacitor and the first switch are implemented on an integrated circuit;
the second capacitor and the second switch are implemented on the integrated circuit.

7. The charge pump of claim 6, further comprising:
a potential setting circuit coupled to the second circuit node and selectively sets, based on the first switch control signal, the second circuit node to a first potential.

8. The charge pump of claim 1 wherein the first capacitor is implemented as a metal capacitor on the integrated circuit.

9. A charge pump, comprising:
an output node;
a first capacitor having a first terminal coupled to a first circuit node;
a first switch having a first current electrode coupled to the first circuit node, a control electrode coupled to receive a first switch control signal, and a second current electrode coupled to the output node, wherein the first switch control signal controls charge transfer between the first capacitor and the output node;
a potential setting circuit coupled to the first circuit node, wherein the potential setting circuit selectively sets, based on the first switch control signal, the first circuit node to a first potential;
wherein the potential setting circuit has a first current electrode coupled to a node whose voltage is dependent upon a voltage of the output node and a second current electrode coupled to the first circuit node, wherein the first potential is dependent upon on the voltage of the output node.

10. The charge pump of claim 9, further comprising:
a comparator having a first input coupled the output node;
a current source coupled to an output of the comparator; and
a second switch having a first current electrode coupled to a second input of the comparator, a control electrode coupled to the output node, and a second current electrode coupled to the current source.

11. A charge pump, comprising:
an output node;
a first capacitor having a first terminal coupled to a first circuit node;
a first switch having a first current electrode coupled to the first circuit node, a control electrode coupled to receive a first switch control signal, and a second current electrode coupled to the output node, wherein the first switch control signal controls charge transfer between the first capacitor and the output node;
a second capacitor having a first terminal coupled to a second terminal of the first capacitor and a second terminal coupled to a first voltage supply.

12. The charge pump of claim 11, further comprising:
a third switch having a first current electrode coupled to the first terminal of the second capacitor, a second current electrode coupled to the first voltage supply, and a control electrode coupled to receive an enable signal, wherein the third switch selectively enables the second capacitor in response to the enable signal.

13. A charge pump, comprising:
an output node;
a first capacitor having a first terminal coupled to a first circuit node;
a first switch having a first current electrode coupled to the first circuit node, a control electrode coupled to receive it first switch control signal, and a second current electrode coupled to the output node, wherein the first switch control signal controls charge transfer between the first capacitor and the output node;
a second capacitor having a first terminal coupled to a terminal of the first capacitor and a second terminal coupled to a first voltage supply;
a second switch having a first current electrode coupled to the first terminal of the second capacitor, a second current electrode coupled to the first voltage supply, and a control electrode coupled to receive an inverse of the first switch control signal.

14. A charge pump, comprising:
an output node:
a first capacitor having a first terminal coupled to a first circuit node;
a first switch having a first current electrode coupled to the first circuit node, a control electrode coupled to receive a first switch control signal, and a second current electrode coupled to the output node, wherein the first switch control signal controls charge transfer between the first capacitor and the output node;
a second capacitor having a first terminal coupled to a second circuit node; and
a second switch having a first current electrode coupled to the second circuit node, a control electrode coupled to receive a second switch control signal, and a second current electrode coupled to the output node, wherein the second switch control signal controls charge transfer between the second capacitor and the output node;
a first potential setting circuit coupled to the first circuit node, wherein the first potential setting circuit selectively sets, based on the first switch control signal, the first circuit node to a first potential, wherein the first potential is dependent upon on a voltage of the output node
a second potential setting circuit coupled to the second circuit node wherein the second potential setting circuit selectively sets, based on the second switch control signal, the second circuit node to a second potential, wherein the second potential is dependent upon on the voltage of the output node.

15. The charge pump of claim 14, wherein the second potential is different from the first potential.

16. A phase locked loop circuit including the charge pump of claim 14, the phase locked loop circuit further comprising:
a filter capacitor having a first terminal coupled to the output node;
a phase frequency detector circuit having a first input to receive a first clock, a second input to receive a second clock, and a first output to provide the first switch control signal based on the first clock and the second clock and a second output to provide the second switch control signal based on the first clock and the second clock;
a voltage controlled oscillator having an input coupled to the output node and an output to provide an output clock.

17. The charge pump of claim 14 wherein:
the first potential setting circuit has a first current electrode coupled to a node whose voltage is dependent upon the voltage of the output node and a second current electrode coupled to the first circuit node;

the second potential setting circuit has a first current electrode coupled to a node whose voltage is dependent upon a voltage of the output node and a second current electrode coupled to the second circuit node.

18. A charge pump, comprising:
an output node;
a first capacitor having a first terminal coupled to a first circuit node;
a first switch having a first current electrode coupled to the first circuit node, a control electrode coupled to receive a first switch control signal, and a second current electrode coupled to the output node, wherein the first switch control signal controls charge transfer between the first capacitor and the output node;
a second capacitor having a first terminal coupled to a first supply voltage;
a second switch having a control electrode coupled to receive the first switch control signal, a first current electrode coupled to a second terminal of the first capacitor, and a second current electrode coupled to a second terminal of the second capacitor wherein, the second switch selectively couples, based on the first switch control signal, the first capacitor and the second capacitor in series.

19. The charge pump of claim 18, wherein the first switch couples the first terminal of the first capacitor to the output node and the second switch couples the second terminal of the first capacitor to the second terminal of the second capacitor when the first switch control signal is at a first state.

20. The charge pump of claim 18, further comprising a third switch having a first current electrode coupled to the second terminal of the second capacitor, a second current electrode coupled to the output node, and a control electrode coupled to receive a second switch control signal.

21. The charge pump of claim 20, wherein the third switch selectively couples, based on the second switch control signal, the second terminal of the second capacitor to the output node.

22. The charge pump of claim 21, further comprising:
a first potential setting circuit coupled to the first capacitor, the potential setting circuit selectively setting, based on the first switch control signal, the first circuit node to a first potential;
a second potential setting circuit coupled to the second terminal of the second capacitor and selectively setting, based on the first switch control signal and a second switch control signal, the second terminal of the second capacitor to the first potential.

23. The charge pump of claim 22, wherein the first potential is based on a voltage of the output node.

24. A phase locked loop (PLL) circuit comprising:
a filter capacitor;
a phase frequency detector circuit having a first input to receive a first clack, a second input to receive a second clock, and a first output to provide a first clock control signal based on the first clock and the second clock, wherein the phase frequency detector circuit has a second output to provide a second clock control signal based on the first clock and the second clock;
a voltage controlled oscillator having an input coupled to a first terminal of the filter capacitor and an output to provide an output clock;
a charge pump having a first input to receive the first clock control signal and an output coupled to the first terminal of the filter capacitor and the input of the voltage controlled oscillator, the charge pump comprising:
a first capacitor having a first terminal:
a first switch having a first current electrode coupled to the first terminal of the first capacitor, a control electrode coupled to receive the first clock control signal, and a second current electrode coupled to the first terminal of the filter capacitor, tho first switch selectively coupling the first capacitor to the filter capacitor, based on the first clock control signal;
a second capacitor;
a second switch having a first current electrode coupled to a first terminal of the second capacitor, a second current electrode coupled to the first terminal of the filter capacitor, and a control electrode coupled to receive the second clock control signal, the second switch selectively coupling the second capacitor to the filter capacitor, based on the second clock control signal;
a potential setting circuit coupled to the first terminal of the first capacitor, wherein the potential setting circuit selectively sets, based on the first clock control signal, the first terminal of the first capacitor to a first potential;
a second potential setting circuit coupled to the first terminal of the second capacitor, wherein the second potential setting circuit selectively sets, based on the second clock control signal, the first terminal of the second capacitor to a second potential;
wherein the first and second potentials are dependent upon a voltage of the output node.

25. The PLL circuit of claim 24, wherein the charge pump further comprises a third capacitor having a first terminal coupled to a terminal of the first capacitor and a second terminal coupled to a first voltage supply.

26. The PLL circuit claim 24 wherein the PLL circuit is implemented on an integrated circuit.

27. The PLL circuit of claim 26 wherein the first capacitor is implemented as a metal capacitor.

28. The PLL circuit of claim 24, further comprising:
a frequency divider having an input to receive the output clock and an output to provide the second clock.

29. The PLL circuit of claim 24, wherein a filter capacitor that is significantly larger than the first capacitor.

30. The PLL circuit of claim 24 wherein the first potential and the second potential are at different potentials.

31. A charge pump, comprising:
an output node;
a first capacitor having a first terminal coupled to a first circuit node;
a first switch having a first current electrode coupled to the first circuit node, a control electrode coupled to receive a first switch control signal, and a second current electrode coupled to the output node, wherein the first switch control signal controls charge transfer between the first capacitor and the output node;
wherein the first switch includes a pass gate, the pass gate having a second control electrode coupled to receive an inverse of the first switch control signal.

32. A charge pump comprising:
an output node;
a charge path including a first capacitor;
a first switch including a control electrode coupled to receive a first charge control signal, wherein the first capacitor selectively provides charge based on the first charge control signal, to the output node via the first switch;

a discharge path including a second capacitor;

a second switch having a control electrode coupled to receive a second charge control signal, wherein the second capacitor selectively receives charge, based on the second charge control signal, from the output node.

33. The charge pump of claim 32, further comprising:

a first potential setting circuit coupled to a first terminal of the first capacitor, wherein the first potential setting circuit selectively sets, based on the first charge control signal, the first terminal of the first capacitor to a first potential; and a second potential setting circuit coupled to a first terminal of the second capacitor, wherein the second potential setting circuit selectively sets, based on the second charge control signal, the first terminal of the second capacitor to a second potential.

34. The charge pump of claim 33 wherein the first potential is equal to the second potential.

35. The charge pump of claim 33 wherein the first and second potentials are dependent upon a voltage of the output node.

36. The charge pump of claim 32, further comprising:

a third capacitor, wherein the third capacitor is coupled in series with the first capacitor, and wherein the first and third capacitors selectively provide charge, based on the first charge control signal and an enable signal, to the output node via the first switch; and a fourth capacitor, wherein the fourth capacitor is coupled in series with the second capacitor, and wherein the second and fourth capacitors selectively receive charge, based on the second charge control signal and an enable signal, from the output node via the second switch.

37. The charge pump of claim 36, wherein:

when the enable signal has a first value, the first capacitor and not the third capacitor selectively provides charge, based on the first charge control signal, to the output node via the first switch, and when the enable signal has a second value, the first capacitor and the third capacitor selectively provide charge, based on the first charge control signal, to the output node via the first switch.

38. The charge pump of claim 32, further comprising:

a third capacitor, the third capacitor selectively provides charge, based on a signal dependent upon the first charge control signal, to the output node;

a fourth capacitor, the fourth capacitor selectively receives charge, based on a signal dependent upon the second charge control signal, from the output node.

39. A phase locked loop circuit including the charge pump of claim 32, the phase locked loop circuit further comprising:

a filter capacitor having a first terminal coupled to the output node;

a phase frequency detector circuit having a first input to receive a first clock, a second input to receive a second clock, and a first output to provide the first charge control signal based on the first clock and the second clock and a second output to provide the second charge control signal based on the first clock and the second clock;

a voltage controlled oscillator having an input coupled to the output node and an output to provide an output clock.

40. The charge pump of claim 32, further wherein:

the first switch has a first current electrode coupled to a first terminal of the first capacitor and has a second current electrode coupled to the output node;

the first capacitor selectively provides charge, based on the first charge control signal, to the output node via the first switch:

the second switch has a first current electrode coupled to a first terminal of the second capacitor and has a second current electrode coupled to the output node;

the second capacitor selectively receives charge, based on the second charge control signal, from the output node via the second switch.

41. A charge pump, comprising:

an output node:

a first capacitor having a first terminal coupled to a first circuit node;

a first switch having a first current electrode coupled to the first circuit node, a control electrode coupled to receive a first switch control signal, and a second current electrode coupled to the output node, wherein the first switch control signal controls charge transfer between the first capacitor and the output node;

a second capacitor having a first terminal coupled to a second circuit node; and a second switch having a first current electrode coupled to the second circuit node, a control electrode coupled to receive a second switch control signal, and a second current electrode coupled to the output node, wherein the second switch control signal controls charge transfer between the second capacitor and the output node;

a third capacitor having a first terminal coupled to a third circuit node;

a third switch having a first current electrode coupled to the third circuit node, a second current electrode coupled to the output node;

a first delay circuit having an input coupled to receive the first switch control signal and an output coupled to a control electrode of the third switch;

a fourth capacitor having a first terminal coupled to a fourth circuit node;

a fourth switch having a first current electrode coupled to the fourth circuit node, a second current electrode coupled to the output node;

a second delay circuit having an input coupled to receive the second switch control signal and an output coupled to a control electrode of the fourth switch.

42. The charge pump of claim 41 wherein a second terminal of the first capacitor is coupled to a first voltage supply, wherein a second terminal of the second capacitor is coupled to a second voltage supply, different from the first voltage supply.

43. The charge pump of claim 41 wherein a second terminal of the first capacitor is coupled to a first voltage supply, wherein a second terminal of the second capacitor is coupled to the first voltage supply.

* * * * *

UNITED STATES PATENT AND TRADEMARK OFFICE
CERTIFICATE OF CORRECTION

PATENT NO. : 6,844,762 B2  
APPLICATION NO. : 10/283869  
DATED : January 18, 2005  
INVENTOR(S) : Hector Sanchez Page 1 of 1

It is certified that error appears in the above-identified patent and that said Letters Patent is hereby corrected as shown below:

In Column 14, Line 3, Claim No. 13:
Change "it first switch control signal" to --a first switch control signal--

In Column 15, Line 41, Claim No. 22:
Change "The charge pump of claim 21, further comprising:" to --The charge pump of claim 18, further comprising:--

In Column 15, Line 57, Claim No. 24:
Change "receive a first clack, a second input" to --receive a first clock, a second input--

In Column 16, Line 8, Claim No. 24:
Change "first terminal of the filter capacitor, tho first switch" to --first terminal of the filter capacitor, the first switch--

In Column 16, Line 42, Claim No. 29:
Change "The PLL circuit of claim 24, wherein a filter capacitor" to --The PLL circuit of claim 24 wherein a filter capacitor--

Signed and Sealed this

Fourteenth Day of October, 2008

JON W. DUDAS  
*Director of the United States Patent and Trademark Office*